(12) United States Patent
Kashiwagi et al.

(10) Patent No.: US 7,807,736 B2
(45) Date of Patent: Oct. 5, 2010

(54) SEMICONDUCTOR DEVICE ENCAPSULATED BY SILICONE RESIN COMPOSITION, AND SILICONE RESIN TABLET FOR ENCAPSULATING SEMICONDUCTOR DEVICE

(75) Inventors: Tsutomu Kashiwagi, Annka (JP); Toshio Shiobara, Tokyo (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 554 days.

(21) Appl. No.: 11/778,980

(22) Filed: Jul. 17, 2007

(65) Prior Publication Data

US 2008/0021136 A1 Jan. 24, 2008

(30) Foreign Application Priority Data

Jul. 18, 2006 (JP) .............................. 2006-195492

(51) Int. Cl.
*C08K 5/3477* (2006.01)
*C08G 77/00* (2006.01)

(52) U.S. Cl. .............................. 524/101; 257/E31.117; 525/476; 528/10

(58) Field of Classification Search ................. 524/101; 257/E31.117; 525/476; 528/10
See application file for complete search history.

(56) References Cited

U.S. PATENT DOCUMENTS

| 7,019,100 | B2 | 3/2006 | Tabei et al. |
| 2005/0006794 | A1 | 1/2005 | Kashiwagi et al. |
| 2005/0129957 | A1 | 6/2005 | Kashiwagi et al. |
| 2009/0118440 | A1* | 5/2009 | Nakanishi et al. ........... 525/478 |

FOREIGN PATENT DOCUMENTS

| JP | 7-25987 | A | 1/1995 |
| JP | 3241338 | B2 | 12/2001 |
| JP | 2004-339482 | A | 12/2004 |
| JP | 2005-76003 | A | 3/2005 |

OTHER PUBLICATIONS

European Search Report dated Jan. 4, 2008 issued in corresponding European Application No. EP 07 01 3967.

* cited by examiner

*Primary Examiner*—Kriellion A Sanders
(74) *Attorney, Agent, or Firm*—Westerman, Hattori, Daniels & Adrian, LLP (57) ABSTRACT

A semiconductor device which is not a light emitting semiconductor device is provided. This device is encapsulated with a silicone resin composition which is solid at room temperature and liquid at molding temperature, and which cures into a transparent article having a hardness measured by Type D durometer according to JIS K 6253 of at least 30 and an elongation in a tensile test of at least 5%.

4 Claims, 1 Drawing Sheet

SEMICONDUCTOR DEVICE ENCAPSULATED BY SILICONE RESIN COMPOSITION, AND SILICONE RESIN TABLET FOR ENCAPSULATING SEMICONDUCTOR DEVICE

CROSS-REFERENCE TO RELATED APPLICATION

This non-provisional application claims priority under 35 U.S.C. §119(a) on Patent Application No. 2006-195492 filed in Japan on Jul. 18, 2006, the entire contents of which are hereby incorporated by reference.

TECHNICAL FIELD

This invention relates to a semiconductor device which is not a light emitting semiconductor device comprising a semiconductor device which is not a light emitting semiconductor device as typically represented by an LED (light-emitting diode) (namely, a photodetecting semiconductor device such as a photodetecting phototransistor, a photodiode, or a photocoupler or a non-light emitting semiconductor element such as various semiconductor elements not associated with the light emission/photodetection) adhered to a substrate, wherein the non-light emitting semiconductor element is covered with a cured silicone resin composition which has low stress properties and transparency. More specifically, this invention relates to a semiconductor device which is not a light emitting semiconductor device which has been encapsulated with a silicone resin composition which is solid at room temperature and which exhibits certain properties as a cured product, excellent surface tackiness, and improved strength properties. This invention also relates to a silicone resin molded tablet for use in encapsulating a semiconductor device.

BACKGROUND ART

Figure 1:
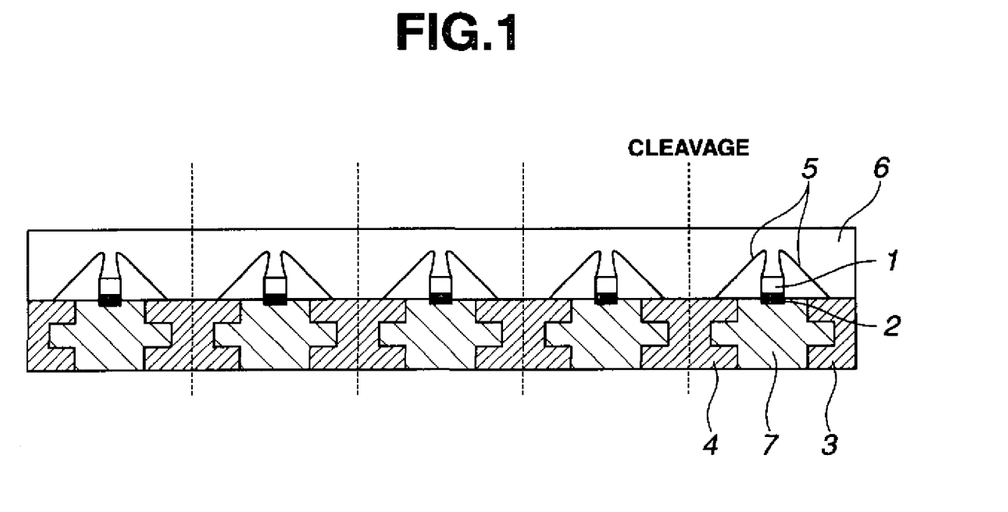
FIG. 1 is a cross sectional view of the surface mounted photodetecting phototransistor semiconductor device.
Figure 2:
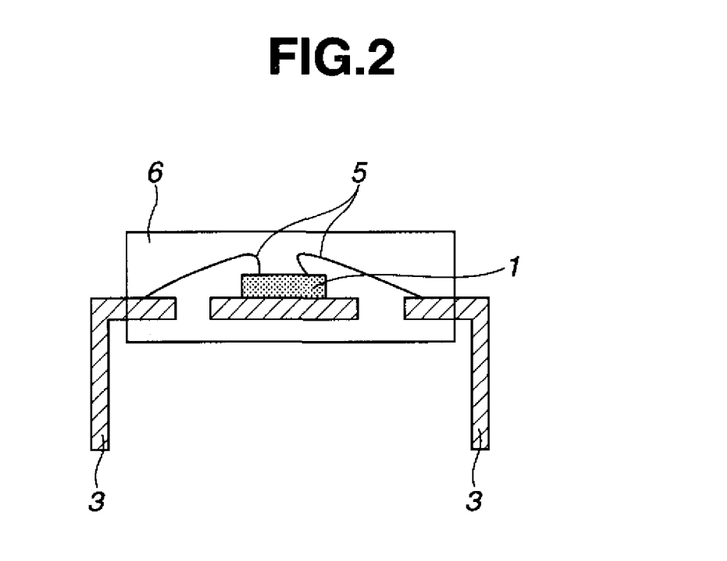
FIG. 2 is a cross sectional view of the insertion mounted photodetecting phototransistor semiconductor device.

For a photodetecting semiconductor device such as a photodetecting phototransistor, a photodiode, or a photocoupler, a photodetecting semiconductors device as shown in FIGS. 1 and 2 called "surface mount type" and "insertion mount type" have been used. In these devices, the photodetecting semiconductor device placed on a lead electrode is encapsulated with a transparent resin, and most products have been encapsulated with an epoxy resin. However, such use of the epoxy resin is facing the problem of discoloration at high temperature since solder reflowing is recently carried out at a higher temperature due to the prohibition of the use of lead solder corresponding to the requirement of reducing the stress on the environment.

FIGS. 1 and 2 shows a photodetector 1, a silicone die bonding material 2, leads 3 and 4, a gold wire 5, a cured resin composition of epoxy-silicone mixture 6, and a ceramic casing 7.

Semiconductor elements such as a photodetector have been secured to a lead flame, a ceramic substrate, or an organic substrate by using an epoxy adhesive (die bonding material), and covered and protected with an epoxy resin such as a bisphenol A epoxy resin or an alicyclic epoxy resin and an acid anhydride curing agent which is transparent after curing (Patent Document 1: JP-B2 3241338, Patent Document 2: JP-A 7-25987). However, silicone rubber compositions having a higher heat and light resistance are recently used for the LED encapsulation. These silicone rubber compositions, however, suffer from the problem of surface tackiness, and hence, dust deposition when used for coating an electric and electronic parts.

In the meanwhile, silicone varnish which has obviated the problems as described above have been developed. The silicone varnish, however, suffered from crack generation. Accordingly, a silicone composition which provides a cured product which does not suffer from dust deposition when used in packaging an electric or electronic part, and which exhibits excellent crack resistance and impact strength is highly awaited. Also demanded is a silicone resin composition which is solid at room temperature and which can be cured by transfer molding and compression molding in conventional apparatus.

Prior art which may be related to the present invention are disclosed in the documents as described above and also in the following documents.

[Patent Document 1] JP-B2 3241338
[Patent Document 2] JP-A 7-25987
[Patent Document 3] JP-A 2005-76003
[Patent Document 4] JP-A 2004-339482 corresponding to U.S. Pat. No. 7,019,100

DISCLOSURE OF THE INVENTION

It has been known that a silicone rubber composition which cures by addition reaction can be improved to exhibit a higher strength after curing by incorporating a resin polyorganosiloxane in the composition. However, even if the strength of the cured article were improved by adding such resin polyorganosiloxane, the article still suffered from the problem of the surface tackiness and dust deposition. The hard resin had the problem of insufficient impact strength, and in particular, insufficient crack generation in the thermal shock test, and this has been a serious problem.

An object of the present invention is to provide a semiconductor device which is not a light emitting semiconductor device which has been encapsulated by an addition curable silicone resin composition, which forms a cured product having improved flexibility and reduced surface tackiness while being a hard resin at room temperature, and which can be readily molded by a conventional molding apparatus such as transfer molding, compression molding, and injection molding apparatus. Another object of the present invention is to provide a silicone resin tablet for encapsulating the semiconductor device.

In order to solve the problems as described above, the inventors of the present invention have made an extensive study, and found that a semiconductor device which is not a light emitting semiconductor device encapsulated with a silicone resin composition of addition curing type (silicone encapsulating agent) which is solid at room temperature and liquid at molding temperature, and which cures into a transparent article having a hardness measured by Type D durometer according to JIS K 6253 of at least 30 and an elongation in a tensile test of at least 5% is effective in realizing the intended reliability. More specifically, the inventors found that an addition curable silicone resin composition using (A) a polyorganosiloxane having a resin structure comprising $R^1SiO_{1.5}$ unit, $R^2_2SiO$ unit, and $R^3_aR^4_bSiO_{(4-a-b)/2}$ unit wherein $R^1$, $R^2$, and $R^3$ are respectively methyl group, ethyl group, propyl group, cyclohexyl group, or phenyl group, $R^4$ is vinyl group or allyl group, a is 0, 1, or 2, b is 1 or 2, and a+b is 2 or 3, and number of recurrence of the $R^2_2SiO$ unit is 5 to 300 for the alkenyl group-containing organopolysiloxane; and (B) a polyorganohydrogen siloxane having a resin structure comprising $R^1SiO_{1.5}$ unit, $R^2_2SiO$ unit, and $R^3_cH_d$ $SiO_{(4-c-d)/2}$ unit wherein $R^1$, $R^2$, and $R^3$ are as defined above, c is 0, 1, or 2, d is 1 or 2, and c+d is 2 or 3, and number of recurrence of the $R^2_2SiO$ unit is 5 to 300, for the polyorganohydrogen siloxane is capable of forming a cured product which has improved flexibility and reduced surface tackiness while it is a hard resin at room temperature, and is also readily moldable by a conventional molding apparatus. The present invention has been completed on the bases of such findings.

Accordingly, the present invention provides a semiconductor device which is not a light emitting semiconductor device and a silicone resin tablet for encapsulating a semiconductor device.

(1) A semiconductor device which is not a light emitting semiconductor device encapsulated with a silicone resin composition which is solid at room temperature and liquid at molding temperature, and which cures into a transparent article having a hardness measured by Type D durometer according to JIS K 6253 of at least 30 and an elongation in a tensile test of at least 5%.

(2) The semiconductor device which is not a light emitting semiconductor device according to the above (1) wherein the silicone resin composition comprises (A) a polyorganosiloxane having a resin structure comprising $R^1SiO_{1.5}$ unit, $R^2_2SiO$ unit, and $R^3_aR^4_bSiO_{(4-a-b)/2}$ unit wherein $R^1$, $R^2$, and $R^3$ are respectively methyl group, ethyl group, propyl group, cyclohexyl group, or phenyl group, $R^4$ is vinyl group or allyl group, a is 0, 1, or 2, b is 1 or 2, and a+b is 2 or 3, and number of recurrence of the $R^2_2SiO$ unit is 5 to 300;

(B) a polyorganohydrogen siloxane having a resin structure comprising $R^1SiO_{1.5}$ unit, $R^2_2SiO$ unit, and $R^3_cH_d SiO_{(4-c-d)/2}$ unit wherein $R^1$, $R^2$, and $R^3$ are as defined above, c is 0, 1, or 2, d is 1 or 2, and c+d is 2 or 3, and number of recurrence of the $R^2_2SiO$ unit is 5 to 300, the component (B) used at an amount such that molar ratio of hydrogen atom bonded to the silicon atom in the component (B) in relation to vinyl group or allyl group in the component (A) is 0.1 to 4.0; and

(C) a catalytically effective amount of a platinum group metal catalyst.

(3) The semiconductor device which is not a light emitting semiconductor device according the above (2) wherein the component (A) and/or the component (B) contains silanol group.

(4) The semiconductor device which is not a light emitting semiconductor device according to any one of the above (1) to (3) wherein the silicone resin composition further comprises at least one adhesive aid selected from a straight-chain or cyclic organosiloxane oligomer containing 4 to 50 silicon atoms containing at least two functional groups selected from hydrogen atom bonded to the silicon atom (SiH group), an alkenyl group bonded to the silicon atom, an alkoxy silyl group, and an epoxy group in one molecule, and an organoxysilyl-modified isocyanurate compound represented by the following general formula (1) and/or its hydrolyzation and condensation product wherein $R^6$ is independently an organic group represented by the following formula (2)

wherein $R^7$ is hydrogen atom or a monovalent hydrocarbon group containing 1 to 8 carbon atoms, and s is an integer of 1 to 6, or a monovalent hydrocarbon group containing an aliphatic unsaturated bond, and wherein at least one $R^6$ is the organic group of the formula (2).

(5) A silicone resin tablet for encapsulating the semiconductor device which is not a light emitting semiconductor device, produced by compression molding of the silicone resin composition of any one of the above (1) to (3).

EFFECTS OF THE INVENTION

The present invention uses a silicone resin composition which is solid (hard resin) at room temperature, and therefore, conventional method such as transfer molding can be used in producing a cured product thereof. In addition, the cured product has excellent flexibility and reduced surface tackiness while it is a hard resin, and therefore, the semiconductor device which is not a light emitting semiconductor device such as photodetecting semiconductor device encapsulated by the silicone resin composition has extremely high reliability when placed in thermal cycles, and therefore, it can be used in the applications where use of a conventional semiconductor packaging silicone has been difficult.

DESCRIPTION OF THE PREFERRED EMBODIMENTS

The semiconductor device of the present invention is a semiconductor device encapsulated with a silicone resin composition which is solid at room temperature and which becomes liquid at molding temperature, and which cures into a transparent article having a hardness measured by Type D durometer according to JIS K 6253 of at least 30 and an elongation in a tensile test of at least 5%.

In this semiconductor device, the preferable silicone resin composition which realizes the cured article having such properties comprises (A) a polyorganosiloxane having a resin structure,
(B) a polyorganohydrogen siloxane having a resin structure,
(C) a platinum group-catalyst, and
(D) an optional component.

(A) Polyorganosiloxane Having a Resin Structure

The polyorganosiloxane having a resin structure (namely, a tertiary network structure) which is an important component of the silicone resin composition of the present invention is the one having a resin structure (namely, a tertiary network structure) comprising $R^1SiO_{1.5}$ unit, $R^2{}_2SiO$ unit, and $R^3{}_aR^4{}_bSiO_{(4-a-b)/2}$ unit wherein $R_1$, $R^2$, and $R^3$ are respectively methyl group, ethyl group, propyl group, cyclohexyl group, or phenyl group, $R^4$ is vinyl group or allyl group, a is 0, 1, or 2, b is 1 or 2, and a+b is 2 or 3, and number of recurrence of the $R^2{}_2SiO$ unit is 5 to 300, preferably 10 to 200, and more preferably 10 to 100. The "number of recurrence of the $R^2{}_2SiO$ unit is 5 to 300" means that at least 50% by mole (50 to 100% by mole), and in particular, at least 80% by mole (80 to 100% by mole) of the all $R^2{}_2SiO$ units in the component (A) form straight chain diorganopolysiloxane chains having the structure:

Wherein m is an integer of 5 to 300, and that the remaining $R^2{}_2SiO$ units are not involved in the straight chain structure containing 5 or more $R^2{}_2SiO$ units (namely, present as a monomer $R^2{}_2SiO$ unit or a chain of $R^2{}_2SiO$ units containing up to 4 $R^2{}_2SiO$ units).

In this composition, the $R^2{}_2SiO$ unit forms a chain polymer, and this polymer can be converted into a polymer in branched or network form by introducing an $R^1SiO_{1.5}$ unit into this polymer. The $R^4$ (vinyl group or allyl group) in the $R^3{}_aR^4{}_bSiO_{(4-a-b)/2}$ unit undergoes an addition reaction (hydrosilylation) with the hydrogen atom bonded to the silicon atom (namely, SiH group) in the $R^3{}_cH_dSiO_{(4-c-d)/2}$ unit in the component (B) as described below to form a cured product.

The $R^1SiO_{1.5}$ unit, the $R^2{}_2SiO$ unit, and the $R^3{}_aR^4{}_bSiO_{(4-a-b)/2}$ unit constituting the component (A) are preferably included at a molar ratio of (90 to 24):(75 to 9):(50 to 1), and in particular, at (70 to 28):(70 to 20):(10 to 2) in view of the physical properties of the cured product.

The component (A) is preferably a solid or semi-solid polyorganosiloxane having a weight average molecular weight in terms of polystyrene as measured by gel permeation chromatography (GPC) of 3,000 to 1,000,000, and in particular, 10,000 to 100,000 in view of handling convenience and curability.

Such polyorganosiloxane having a resin structure can be synthesized, for example, by simultaneously hydrolyzing and condensing a combination of compounds which are respectively the starting materials of each unit in the presence of an acid.

Exemplary starting materials for the $R^1SiO_{1.5}$ unit include $MeSiCl_3$, $E2tSiCl_3$, $PhSiCl_3$ (wherein Me stands for methyl group, Et stands for ethyl group, and Ph stands for phenyl group, these abbreviations also used in the following descriptions), propyltrichlorosilane, cyclohexyltrichlorosilane and alkoxysilanes such as methoxy silane corresponding such chlorosilane.

Exemplary starting materials for the $R^2{}_2SiO$ unit include
$ClMe_2SiO(Me_2SiO)_qSiMe_2Cl$,
$ClMe_2SiO(Me_2SiO)_p(PhMeSiO)_qSiMe_2Cl$,
$ClMe_2SiO(Me_2SiO)_p(Ph_2SiO)_qSiMe_2Cl$,
$HOMe_2SiO(Me_2SiO)_qSiMe_2OH$,
$HOMe_2SiO(Me_2SiO)_p(PhMeSiO)_qSiMe_2OH$,
$HOMe_2SiO(Me_2SiO)_p(Ph_2SiO)_qSiMe_2OH$,
$MeOMe_2SiO(Me_2SiO)_qSiMe_2OMe$,
$MeOMe_2SiO(Me_2SiO)_p(PhMeSiO)_qSiMe_2OMe$, and
$MeOMe_2SiO(Me_2SiO)_p(Ph_2SiO)_qSiMe_2OMe$ wherein p is an integer of 5 to 150 and q is an integer of 5 to 300.

The term "$R^3{}_aR^4{}_bSiO_{(4-a-b)/2}$ unit" designates any combination of at least one siloxane unit selected from $R^3R^4SiO$ unit, $R^3{}_2R^4SiO_{0.5}$ unit, $R^4{}_2SiO$ unit, and $R^3R^4{}_2SiO_{0.5}$ unit, and exemplary starting materials for the $R^3{}_aR^4{}_bSiO_{(4-a-b)/2}$ unit include $Me_2ViSiCl$, $MeViSiCl_2$, $Ph_2ViSiCl$ (wherein Vi stands for vinyl group, the abbreviation also used in the following descriptions), $PhViSiCl_2$, and alkoxysilanes such as methoxy silane corresponding such chlorosilane.

The component (A) may be the one containing a silanol group-containing siloxane unit which is generated as a byproduct in the course of the simultaneous hydrolysis and condensation with the $R^1SiO_{1.5}$ unit, the $R^2{}_2SiO$ unit, and/or the $R^3{}_aR^4{}_bSiO_{(4-a-b)/2}$ unit at an amount of up to about 10% by mole (0 to 10% by mole), and preferably up to about 5% by mole (0 to 5% by mole) in relation to all siloxane units. Exemplary silanol group-containing siloxane units corresponding to the siloxane units include $R^1(HO)SiO$ unit, $R^1(HO)_2SiO_{0.5}$ unit, $R^2{}_2(HO)Si_{0.5}$ unit, $R^3{}_aR^4{}_b(HO)SiO_{(3-a-b)/2}$ unit, and $R^3{}_aR^4{}_b(HO)_2SiO_{(2-a-b)/2}$ unit (wherein a is 0 or 1, b is 1 or 2, and a+b is 1 or 2).

(B) Polyorganohydrogen Siloxane Having a Resin Structure

The polyorganohydrogen siloxane having a resin structure (namely, a tertiary network structure) which is an important component of the silicone resin composition of the present invention is a polyorganohydrogen siloxane having a resin structure comprising $R^1SiO_{1.5}$ unit, $R^2{}_2SiO$ unit, and $R^3{}_cH_dSiO_{(4-c-d)/2}$ unit wherein $R^1$, $R^2$, and $R^3$ are as defined above, c is 0, 1, or 2, d is 1 or 2, and c+d is 2 or 3, and number of recurrence of the $R^2{}_2SiO$ unit is 5 to 300, and preferably 10 to 200, and more preferably 10 to 100. The "number of recurrence of the $R^2{}_2SiO$ unit is 5 to 300" means that at least 50% by mole (50 to 100% by mole), and in particular, at least 80% by mole (80 to 100% by mole) of the all $R^2{}_2SiO$ units in the component (B) form straight chain diorganopolysiloxane chains having the structure:

wherein m is an integer of 5 to 300, and that the remaining $R^2{}_2SiO$ units are not involved in the straight chain structure containing 5 or more $R^2{}_2SiO$ units (namely, present as monomer $R^2{}_2SiO$ unit or a chain of $R^2{}_2SiO$ units containing up to 4 $R^2{}_2SiO$ units).

The functions of the $R^1SiO_{1.5}$ unit, the $R^2{}_2SiO$ unit, and the $R^3{}_cH_dSiO_{(4-c-d)/2}$ unit in this composition are as described above.

The $R^1SiO_{1.5}$ unit, the $R^2{}_2SiO$ unit, and the $R^3{}_cH_dSiO_{(4-c-d)/2}$ unit are preferably included at a molar ratio of (90 to 24):(75 to 9):(50 to 1), and in particular, at (70 to 28):(70 to 20):(10 to 2) in view of the physical properties of the cured product.

The component (B) is preferably a polyorganohydrogen siloxane having a weight average molecular weight in terms of polystyrene as measured by GPC of 3,000 to 1,000,000, and in particular, 10,000 to 100,000 in view of handling convenience and physical properties of the cured product.

Such polyorganohydrogen siloxane having a resin structure can be synthesized, for example, by simultaneously hydrolyzing and condensing a combination of compounds which are respectively the starting materials of each unit.

Exemplary starting materials for the $R^1SiO_{1.5}$ unit include $MeSiCl_3$, $EtSiCl_3$, $PhSiCl_3$, propyltrichlorosilane, cyclohexyltrichlorosilane and alkoxysilanes such as methoxy silane corresponding such chlorosilane.

Exemplary starting materials for the $R^2{}_2SiO$ unit include
$ClMe_2SiO(Me_2SiO)_qSiMe_2Cl$,
$ClMe_2SiO(Me_2SiO)_p(PhMeSiO)_qSiMe_2Cl$,
$ClMe_2SiO(Me_2SiO)_p(Ph_2SiO)_qSiMe_2Cl$,
$HOMe_2SiO(Me_2SiO)_pSiMe_2OH$,
$HOMe_2SiO(Me_2SiO)_p(PhMeSiO)_qSiMe_2OH$,
$HOMe_2SiO(Me_2SiO)_p(Ph_2SiO)_qSiMe_2OH$,
$MeOMe_2SiO(Me_2SiO)_qSiMe_2OMe$,
$MeOMe_2SiO(Me_2SiO)_p(PhMeSiO)_qSiMe_2OMe$, and
$MeOMe_2SiO(Me_2SiO)_p(Ph_2SiO)_qSiMe_2OMe$
wherein p is an integer of 5 to 150, and q is an integer of 5 to 300.

The term "$R^3{}_cH_dSiO_{(4-c-d)/2}$ unit" designates any combination of at least one siloxane unit selected from $R^3R^5SiO$ unit, $R^3{}_2R^5SiO_{0.5}$ unit, $R^5{}_2SiO_{0.5}$ unit, and $R^3R^5{}_2SiO_{0.5}$ unit, and exemplary starting materials for the $R^3{}_cH_dSiO_{(4-c-d)/2}$ unit include $Me_2HSiCl$, $MeHSiCl_2$, $Ph_2HSiCl$, $PhHSiCl_2$, and alkoxysilanes such as methoxy silane corresponding such chlorosilane. The silanol group-containing siloxane unit corresponding to the siloxane units include $R^1(HO)SiO$ unit, $R^1(HO)_2SiO_{0.5}$ unit, $R^2{}_2(HO)SiO_{0.5}$ unit, $R^3{}_cH_d(HO)SiO_{(3-c-d)/2}$ unit, and $R^3{}_cH_d(HO)_2SiO_{(2-c-d)/2}$ unit wherein c is 0 or 1, d is 1 or 2, and c+d is 1 or 2.

The polyorganohydrogen siloxane is incorporated at an amount such that molar ratio of hydrogen atom bonded to the silicon atom (SiH group) in the component (B) in relation to vinyl group or allyl group in the component (A) is 0.1 to 4.0, preferably 0.5 to 3.0, and more preferably 0.8 to 2.0. When the amount in the molar ratio is less than 0.1, curing will not proceed and production of the silicone cured article will be difficult. When the amount is in excess of 4.0, a large amount of SiH group will remain unrelated in the cured article, inviting change in the physical properties with time.

The component (B) may be the one containing a silanol group-containing siloxane unit which is generated as a byproduct in the course of the simultaneous hydrolysis and condensation with the $R^1SiO_{1.5}$ unit, the $R^2{}_2SiO$ unit, and/or the $R^3{}_cH_dSiO_{(4-c-d)/2}$ unit at an amount of up to about 10% by mole (0 to 10% by mole), and preferably up to about 5% by mole (0 to 5% by mole) in relation to all siloxane units.

(C) Platinum Group Metal Catalyst

This catalyst component is incorporated in the composition of the present invention to induce curing by addition reaction, and exemplary catalyst components include platinum, palladium, and rhodium series catalysts. The preferred are platinum series catalysts such as platinum, platinum black, chloroplatinic acid, for example, $H_2PtCl.xH_2O$, $K_2PtCl$, $KHPtCl.xH_2O$, $K_2PtCl_4$, $K_2PtCl_4.xH_2O$, and $PtO_2.xH_2O$ (wherein x is a positive integer), and a complex of such catalyst with a hydrocarbon such as an olefin, an alcohol, or a vinyl group-containing polyorganosiloxane in view of the cost, and these catalysts may be used alone or in combination of two or more. Such catalyst component may be incorporated at a so called "catalytic amount", and typically, at 0.1 to 500 ppm, and in particular, at 0.5 to 100 ppm in terms of the weight of the platinum group metal in relation to the total amount of the components (A) and (B).

(D) Other Additives

If desired, the composition of the present invention may also contain various additives known in the art in addition to the components (A) to (C). Exemplary such additives include reinforcing inorganic fillers such as fumed silica and fumed titanium dioxide and non-reinforcing inorganic fillers such as calcium carbonate, calcium silicate, titanium dioxide, ferric oxide, carbon black, and zinc oxide, and these additives may be added at an amount of up to 600 parts by weight (0 to 600 parts by weight) in relation to 100 parts by weight of the total amount of components (A) and (B).

In order to impart adhesiveness with the composition of the present invention, the composition may optionally contain an adhesive aid such as a straight-chain or cyclic organosiloxane oligomer containing 4 to 50, and preferably 4 to 20 silicon atoms containing at least two, and preferably 2 or 3 functional groups selected from hydrogen atom bonded to the silicon atom (SiH group), an alkenyl group bonded to the silicon atom (for example, Si—CH=CH$_2$ group), alkoxy silyl group (for example, trimethoxy silyl group), epoxy group (for example, glycidoxy propyl group, and 3,4-epoxycyclohexylethyl group) in one molecule; and an organoxysilyl-modified isocyanurate compound represented by the following general formula (1) and/or its hydrolyzation and condensation product (organosiloxane-modified isocyanurate compound).

(1)

In the formula, $R^6$ is an organic group represented by the following formula (2):

wherein $R^7$ is hydrogen atom or a monovalent hydrocarbon group containing 1 to 8, and in particular, 1 to 6 carbon atoms, and s is an integer of 1 to 6, and in particular, 1 to 6; or a monovalent hydrocarbon group containing an aliphatic unsaturated bond. At least one $R^6$ is the organic group of the formula (2).

Examples of the monovalent hydrocarbon group containing an aliphatic unsaturated bond of $R^6$ include an alkenyl group containing 2 to 8, and in particular, 2 to 6 carbon atoms such as vinyl group, allyl group, propenyl group, isopropenyl group, butenyl group, isobutenyl group, pentenyl group, hexenyl group, and cyclohexenyl group. Examples of the monovalent hydrocarbon group of $R^7$ include monovalent hydrocarbon groups containing 1 to 8, and in particular, 1 to 6 carbon atoms such as an alkyl group such as methyl group, ethyl group, propyl group, isopropyl group, butyl group, isobutyl group, tert-butyl group, pentyl group, hexyl group, and cyclohexyl group; an alkenyl group such as vinyl group, allyl group, propenyl group, isopropenyl group and the like which are like those mentioned above for $R^6$, and an aryl group such as phenyl group.

Exemplary adhesive aids include the compounds represented by the following formulae.

wherein g and h are respectively a positive integer satisfying the relation that g+h is 2 to 50, and preferably 4 to 20, -continued Among such organosilicon compounds, the compounds capable of realizing particularly excellent adhesiveness after the curing are those containing an alkoxy group bonded to the silicon atom and an alkenyl group or hydrogen atom bonded to the silicon atom (SiH group) in one molecule.

In the present invention, the adhesive aid (an optional component) is added typically at an amount of up to about 10 parts by mass (namely, 0 to 10 parts by mass), preferably at about 0.1 to 8 parts by mass, and more preferably at about 0.2 to 5 parts by mass in relation to 100 parts by weight of the total of the components (A) and (B). When the amount incorporated is excessively low, the resulting composition may have an inferior adhesiveness and an excessively high content may adversely affect the hardness and surface tackiness of the cured product.

The silicone composition of the present invention can be prepared by homogeneously mixing the components as described above. However, the present silicone composition is most typically stored in two parts so that curing does not proceed during the storage and mixed immediately before use for curing. Of course, the silicone composition may be prepared in one part by adding a small amount of curing suppressor such as acetylene alcohol. This composition cures immediately by optional heating to give a flexible cured product having excellent hardness and no surface tackiness and cured article with reduced surface tackiness.

The condition used in the curing in the course of molding is typically 50 to 200° C., and in particular, 70 to 180° C. for 1 to 30 minutes, and in particular, 2 to 10 minutes. The post-curing can be conducted at 50 to 200° C., and in particular, at 70 to 180° C. for 0.1 to 10 hours, and in particular, for 1 to 4 hours.

The silicone resin composition used in the present invention is solid (non-flowable) at room temperature (25° C.), and liquid (flowable) at molding temperature. After curing, it has a hardness as measured at room temperature (25° C.) with Type D durometer by JIS K 6253 of at least 30, preferably 30 to 80, and more preferably 35 to 60. When the hardness is too low, the resin surface tackiness will be unduly high, and the product will suffer from insufficient handling convenience in the mounting of the resin to the semiconductor element in the transportation of the mounted semiconductor element.

The cured product also has an elongation rate as measured by JIS K 6251 of at least 5%, preferably at least 10%, and more preferably at least 20%. While the upper limit of the elongation rate may be adequately determined, the upper limit is typically up to 150%, and in particular, up to 100%. When the elongation rate is too low, the product will exhibit inferior crack resistance when placed in thermal cycle.

The cured product is transparent (colorless), and more preferably, has a transmittance of at least 90% when measured for a cured sheet of 1 mm by spectrophotometer thick at 400 nm to visible range by using air for the reference.

The silicone resin composition used in molding the semiconductor device of the present invention has high handling convenience since it is solid or semi-solid at room temperature, and it can be molded by various known methods used for molding a resin. When transfer molding is used, the silicone resin composition is preliminarily formed into tablets in the shape of a cylinder or other predetermined shape at a low temperature around room temperature, the transfer molding may be conducted by using this tablet. Alternatively, a coating agent or potting agent may be produced by adding a solvent to the silicone resin composition.

The silicone resin composition used for encapsulating the semiconductor device of the present invention may also include other resins, anti-discoloration agent, and light scattering agent as desired.

In the present invention, exemplary semiconductor devices which are not a light emitting semiconductor device (non-light emitting semiconductor element) include photodetecting semiconductor devices such as photodetecting phototransistor, photodiode, and photocoupler. When the composition of the present invention is used as a coating agent or potting agent by incorporating the optional component, it can be used for encapsulation of various semiconductor element not associated with light emission/photodetection which had been encapsulated by a conventional epoxy resin molding compound such as transistor, board on chip-ball grid array, and wafer scale package.

In the case of the surface mounted photodetecting semiconductor device shown in FIG. 1 and the insertion mounted photodetecting semiconductor device shown in FIG. 2, the composition of the present invention is cured instead of curing the epoxy-silicone resin mixture composition shown by numeral 6 in FIGS. 1 and 2, and therefore, curing can be accomplished by conventional transfer molding or injection molding by using a silicone resin composition by applying an elevated pressure at a temperature of 150 to 180° C. for 1 to 3 minutes. In the case of a surface mounted device, the semiconductor device can be readily produced by cutting the cured product into individual semiconductor devices by a dicing saw.

The pressure used in the molding may vary depending on the viscosity of the silicone resin. The pressure, however, is typically 10 Kg/cm² to 100 Kg/cm².

EXAMPLES

Next, the present invention is described in detail by referring to Synthesis Examples, Examples, and Comparative Examples, which by no means limit the scope of the present invention. In the following Examples, the viscosity used is the value measured at 25° C., and the weight average molecular weight is the one measured by gel permeation chromatography (GPC) which is calculated in terms of polystyrene. Ph designates phenyl group, Me designates methyl group, and Vi designates vinyl group.

Synthesis Example 1

27 moles of an organosilane represented by $PhSiCl_3$, 1 mole of $ClMe_2SiO(Me_2SiO)_{33}SiMe_2Cl$, and 3 moles of $MeViSiCl_2$ were dissolved in toluene solvent, and the solution was added dropwise to water for simultaneous hydrolysis. After washing the reaction mixture with water and neutralizing by washing with an alkali, the water was removed, and the solvent was stripped to synthesize vinyl group-containing resin. This resin had a weight average molecular weight of 62,000 and a melting point of 60° C.

Synthesis Example 2

27 moles of an organosilane represented by $PhSiCl_3$, 1 mole of $ClMe_2SiO(Me_2SiO)_{33}SiMe_2Cl$, and 3 moles of $MeHSiCl_2$ were dissolved in toluene solvent, and the solution was added dropwise to water for simultaneous hydrolysis. After washing the reaction mixture with water and neutralizing by washing with an alkali, the water was removed, and the solvent was stripped to synthesize hydrosilyl group-containing resin. This resin had a weight average molecular weight of 58,000 and a melting point of 58° C.

Synthesis Example 3

27 moles of an organosilane represented by $PhSiCl_3$, 1 mole of $ClMe_2SiO(Me_2SiO)_{33}SiMe_2Cl$, and 3 moles of $Me_2ViSiCl$ were dissolved in toluene solvent, and the solution was added dropwise to water for simultaneous hydrolysis. After washing the reaction mixture with water and neutralizing by washing with an alkali, the water was removed, and the solvent was stripped to synthesize vinyl group-containing resin. This resin had a weight average molecular weight of 63,000 and a melting point of 63° C.

Synthesis Example 4

27 moles of an organosilane represented by $PhSiCl_3$, 1 mole of $ClMe_2SiO(Me_2SiO)_{33}SiMe_2Cl$, and 3 moles of $Me_2HSiCl$ were dissolved in toluene solvent, and the solution was added dropwise to water for simultaneous hydrolysis. After washing the reaction mixture with water and neutralizing by washing with an alkali, the water was removed, and the solvent was stripped to synthesize hydrosilyl group-containing resin. This resin had a weight average molecular weight of 57,000 and a melting point of 56° C.

Example 1

A mixture of 189 g of the vinyl group-containing resin produced in the Synthesis Example 1, 189 g of the hydrosilyl group-containing resin produced in the Synthesis Example 2, 0.2 g of ethynylcyclohexanol (an acetylene alcohol series reaction suppressor), and 0.1 g of solution of chloroplatinic acid modified with octyl alcohol was thoroughly stirred in a planetary mixer heated to 60° C. An additive having the following structural formula (adhesive component) was added to the mixture at an amount of 0.5 parts by mass per 100 parts by mass of the total content of the vinyl group-containing resin and the hydrosilyl group-containing resin to produce a silicone resin composition.

This silicone resin composition became solid when it cooled to room temperature, and this solid composition was pulverized to produce a powder.

A photodetecting semiconductor device as shown in FIG. 1 was produced by using a phototransistor chip photosensitive to visible light for the photodetecting phototransistor element. A photodetector 1 was secured to a lead electrode 3 using a silicone die bonding material 2 by heating to 180° C. for 10 minutes. More specifically, the photodetector 1 was connected to the lead electrodes 3 and 4 by a gold wire 5, and the silicone resin composition of the Example 1 was cured by compression molding at 150° C. for 3 minutes, and after removing the cured article from the mold, the cured article was subjected to post-curing at 150° C. for 4 hours, and cut into individual chips to thereby produce surface mounted packages.

In the meanwhile, a photodetector 1 was secured to a lead electrode 3 using a silicone die bonding material 2 by heating to 180° C. for 10 minutes. The resulting lead frame was placed in a mold (a mold adapted for use in transfer molding) which had been heated to 150° C., and cylindrical tablets produced by a compression-molding the powder composition of the present invention at room temperature were introduced to the pot of the transfer molding apparatus. Pressure was applied to the resin with a plunger to thereby transfer and mold the resin under the conditions including a molding temperature of 150° C., a molding time of 3 minutes, and a molding pressure of 50 Kg/cm². Post curing was conducted at 150° C. for 4 hours to thereby produce insertion mounted packages.

The two types of photodetecting semiconductor devices (10 for each type) produced by the procedures as described above were subjected to 1000 cycles of thermal shock test (low temperature, −40° C.; high temperature 120° C.) to thereby evaluate outer appearance (cracks) and number of peelings occurred at the boundary between the die bond material and the silicone molding resin. The results are shown in Tables 2 and 3.

This composition was also subjected to compression molding in a compression molding apparatus at 150° C. for 5 minutes. The cured article was subjected to secondary curing at 150° C. for 4 minutes. The resulting article was evaluated for tensile strength (thickness, 0.2 mm), elongation rate (thickness, 0.2 mm), and hardness (measured by Type D durometer) according to JIS K 6251 and JIS K 6253. Surface tackiness was confirmed by touching the surface with finger. The article was also placed in a commercially available silver powder (average particle side, 5 μm), and after removing the article from the powder, the surface was blown with air to test whether the dust on the surface (namely, the silver powder) could be removed. The composition was also molded in an aluminum dish (diameter, 6 cm; depth 0.6 mm), and the cured sample was introduced in thermal cycles of −50° C. to 150° C. to confirm crack generation. The results of the measurements are shown in Table 1.

Example 2

A mixture of 189 g of the vinyl group-containing resin produced in the Synthesis Example 3, 189 g of the hydrosilyl group-containing resin produced in the Synthesis Example 4, 0.2 g of ethynylcyclohexanol (an acetylene alcohol series reaction suppressor), and 0.1 g of solution of chloroplatinic acid modified with octyl alcohol was thoroughly stirred in a planetary mixer heated to 60° C. An additive having the following structural formula (adhesive component) was added is to the mixture at an amount of 0.5 parts by mass per 100 parts by mass of the total content of the vinyl group-containing resin and the hydrosilyl group-containing resin to produce a silicone resin composition.

This silicone resin composition became solid when it cooled to room temperature, and this solid composition was pulverized to produce a powder.

A photodetecting phototransistor was produced and evaluated by repeating the procedure of Example 1. After the secondary curing, the product was evaluated by repeating the procedure of Example 1 for the mechanical properties (tensile strength, hardness, and elongation rate), the surface tackiness, and crack generation (by thermal cycle evaluation). The results are shown in Tables 1 to 3.

Comparative Example 1

A molded and cured article was produced by repeating the procedure of Example except for the use of a commercially available silicone varnish which cures by addition reaction (KJR-632 manufactured by Shin-Etsu Chemical Co., Ltd.) containing a vinyl group-containing polyorganosiloxane resin not including straight chain diorganopolysiloxane chain structure with the number of recurring unit of 5 to 300 as a main component. After the secondary curing, the product was evaluated by repeating the procedure of Example 1 for the mechanical properties (tensile strength, hardness, and elongation rate), the surface tackiness, and crack generation (by thermal cycle evaluation). The results are shown in Tables 1 to 3.

Comparative Example 2

A molded and cured article was produced by repeating the procedure of Example except for the use of a commercially available silicone varnish which cures by addition reaction (KJR-632L-1 manufactured by Shin-Etsu Chemical Co., Ltd.) containing a vinyl group-containing polyorganosiloxane resin not including straight chain diorganopolysiloxane chain structure with the number of recurring unit of 5 to 300 as a main component. After the secondary curing, the product was evaluated by repeating the procedure of Example 1 for the mechanical properties (tensile strength, hardness, and elongation rate), the surface tackiness, and crack generation (by thermal cycle evaluation). The results are shown in Tables 1 to 3.

TABLE 1

|  | Example | | Comparative Example | |
| --- | --- | --- | --- | --- |
|  | 1 | 2 | 1 | 2 |
| SiH/SiVi | 1.5 | 1.5 | 1.5 | 1.5 |
| Conditions of secondary curing | 150° C./ 4 hr | 150° C./ 4 hr | 150° C./ 4 hr | 150° C./4 hr |
| Hardness (Type D) | 50 | 52 | 70 | 52 |
| Elongation rate (%) | 20 | 20 | 0 | 0 |
| Tensile strength (MPa) | 9 | 9 | 2 | 2 |
| Dust deposition due to surface tackiness | None | None | None | None |

TABLE 2

Surface mounted package:
failure rate in thermal cycle test at −40° C. to 120° C.

|  | Example | | Comparative Example | |
| --- | --- | --- | --- | --- |
|  | 1 | 2 | 1 | 2 |
| 250 cycles | 0/10 | 0/10 | 4/10 (cracks and peeling) | 6/10 (cracks and peeling) |
| 500 cycles | 0/10 | 0/10 | 10/10 (cracks and peeling) | 10/10 (cracks and peeling) |
| 750 cycles | 0/10 | 0/10 | | |
| 1,000 cycles | 0/10 | 0/10 | | |

TABLE 3

Insertion mounted package:
failure rate in thermal cycle test at −40° C. to 120° C.

|  | Example | | Comparative Example | |
| --- | --- | --- | --- | --- |
|  | 1 | 2 | 1 | 2 |
| 250 cycles | 0/10 | 0/10 | 8/10 (cracks and peeling) | 9/10 (cracks and peeling) |
| 500 cycles | 0/10 | 0/10 | 10/10 (cracks and peeling) | 10/10 (cracks and peeling) |
| 750 cycles | 0/10 | 0/10 | | |
| 1,000 cycles | 0/10 | 0/10 | | |

Japanese Patent Application No. 2006-195492 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A semiconductor device which is not a light emitting semiconductor device, the semiconductor device being encapsulated with a silicone resin composition comprising:

(A) a polyorganosiloxane having a resin structure comprising $R^1SiO_{1.5}$ unit, $R^2_2SiO$ unit, and $R^3_aR^4_bSiO_{(4-a-b)/2}$ unit wherein $R^1$, $R^2$, and $R^3$ are respectively methyl group, ethyl group, propyl group, cyclohexyl group, or phenyl group, $R^4$ is vinyl group or allyl group, a is 0, 1, or 2, b is 1 or 2, and a+b is 2 or 3, and number of recurrence of the $R^2_2SiO$ unit is 5 to 300;

(B) a polyorganohydrogen siloxane having a resin structure comprising $R^1SiO_{1.5}$ unit, $R^2_2SiO$ unit, and $R^3_cH_dSiO_{(4-c-d)/2}$ unit wherein $R^1$, $R^2$, and $R^3$ are as defined above, c is 0, 1 or 2, d is 1 or 2, and c+d is 2 or 3, and number of recurrence of the $R^2_2SiO$ unit is 5 to 300, the component (B) used at an amount such that molar ratio of hydrogen atom bonded to the silicon atom in the component (B) in relation to vinyl group or allyl group in the component (A) is 0.1 to 4.0; and (C) a catalytically effective amount of a platinum group metal catalyst, wherein said silicone resin composition is solid at room temperature and liquid at molding temperature, and cures into a transparent article having a hardness measured by Type D durometer according to JIS K 6253 of at least 30 and an elongation in a tensile test of at least 5%.

2. The semiconductor device which is not a light emitting semiconductor device according to claim 1 wherein the component (A) and/or the component (B) contains silanol group.

3. The semiconductor device which is not a light emitting semiconductor device according to claim 1 wherein the silicone resin composition further comprises at least one adhesive aid selected from a straight-chain or cyclic organosiloxane oligomer containing 4 to 50 silicon atoms containing at least two functional groups selected from hydrogen atom bonded to the silicon atom (SiH group), an alkenyl group bonded to the silicon atom, an alkoxy silyl group, and an epoxy group in one molecule, and an organoxysilyl-modified isocyanurate compound represented by the following general formula (1) and/or its hydrolyzation and condensation product (1)

wherein $R^6$ is independently an organic group represented by the following formula (2)

(2)

wherein $R^7$ is hydrogen atom or a monovalent hydrocarbon group containing 1 to 8 carbon atoms, and s is an integer of 1 to 6, or a monovalent hydrocarbon group containing an aliphatic unsaturated bond, and wherein at least one $R^6$ is the organic group of the formula (2).

4. A silicone resin tablet for encapsulating the semiconductor device, which is not a light emitting semiconductor device produced by compression molding of the silicone resin composition of claim 1.

* * * * *